(12) United States Patent
Chang Chien et al.

(10) Patent No.: US 10,950,593 B2
(45) Date of Patent: Mar. 16, 2021

(54) PACKAGE STRUCTURE INCLUDING AT LEAST ONE CONNECTING MODULE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/114,251

(22) Filed: Aug. 28, 2018

(65) Prior Publication Data

US 2019/0164909 A1 May 30, 2019

Related U.S. Application Data

(60) Provisional application No. 62/591,166, filed on Nov. 27, 2017.

(51) Int. Cl.
*H01L 25/00* (2006.01)
*H01L 25/18* (2006.01)
(Continued)

(52) U.S. Cl.
CPC ........... *H01L 25/50* (2013.01); *H01L 21/486* (2013.01); *H01L 21/4857* (2013.01);
(Continued)

(58) Field of Classification Search
CPC ........................ H01L 25/50; H01L 21/4857
See application file for complete search history.

(56) References Cited

U.S. PATENT DOCUMENTS 6,358,836 B1 * 3/2002 Lu .................. H01L 23/3114
257/E21.508
9,349,708 B2 5/2016 Fu et al.
(Continued)

FOREIGN PATENT DOCUMENTS

CN 104253105 12/2014
CN 104952828 9/2015
(Continued)

OTHER PUBLICATIONS

"Office Action of Taiwan Counterpart Application", dated Jun. 11, 2019, pp. 1-7.
(Continued)

*Primary Examiner* — Lex H Malsawma
*Assistant Examiner* — Xia L Cross
(74) *Attorney, Agent, or Firm* — JCIPRNET

(57) ABSTRACT

A package structure including a redistribution structure, a die, at least one connecting module, a first insulating encapsulant, a chip stack, and a second insulating encapsulant. The die is disposed on and electrically connected to the redistribution structure. The connecting module is disposed on the redistribution structure. The connecting module has a protection layer and a plurality of conductive bars. The conductive bars are embedded in the protection layer. The protection layer includes a plurality of openings corresponding to the conductive bars. The first insulating encapsulant encapsulates the die and the connecting module. The chip stack is disposed on the first insulating encapsulant and the die. The chip stack is electrically connected to the connecting module. The second insulating encapsulant encapsulates the chip stack.

13 Claims, 15 Drawing Sheets

(51) Int. Cl.
  *H01L 25/065*    (2006.01)
  *H01L 23/00*     (2006.01)
  *H01L 21/56*     (2006.01)
  *H01L 21/48*     (2006.01)
  *H01L 21/683*    (2006.01)
  *H01L 23/31*     (2006.01)
  *H01L 21/768*    (2006.01)
  *H01L 23/522*    (2006.01)

(52) U.S. Cl.
  CPC ............ *H01L 21/56* (2013.01); *H01L 21/561* (2013.01); *H01L 21/563* (2013.01); *H01L 21/6835* (2013.01); *H01L 21/76843* (2013.01); *H01L 23/3128* (2013.01); *H01L 23/3135* (2013.01); *H01L 23/3157* (2013.01); *H01L 23/5226* (2013.01); *H01L 23/562* (2013.01); *H01L 24/09* (2013.01); *H01L 24/17* (2013.01); *H01L 24/19* (2013.01); *H01L 24/20* (2013.01); *H01L 24/49* (2013.01); *H01L 24/73* (2013.01); *H01L 24/85* (2013.01); *H01L 24/97* (2013.01); *H01L 25/0657* (2013.01); *H01L 25/18* (2013.01); *H01L 21/568* (2013.01); *H01L 24/32* (2013.01); *H01L 24/45* (2013.01); *H01L 24/48* (2013.01); *H01L 24/83* (2013.01); *H01L 2221/68318* (2013.01); *H01L 2221/68345* (2013.01); *H01L 2221/68359* (2013.01); *H01L 2221/68372* (2013.01); *H01L 2221/68381* (2013.01); *H01L 2224/02371* (2013.01); *H01L 2224/02372* (2013.01); *H01L 2224/32145* (2013.01); *H01L 2224/45124* (2013.01); *H01L 2224/45144* (2013.01); *H01L 2224/48091* (2013.01); *H01L 2224/48145* (2013.01); *H01L 2224/48227* (2013.01); *H01L 2224/48235* (2013.01); *H01L 2224/49052* (2013.01); *H01L 2224/73215* (2013.01); *H01L 2224/73265* (2013.01); *H01L 2224/73267* (2013.01); *H01L 2224/83191* (2013.01); *H01L 2225/0651* (2013.01); *H01L 2225/06548* (2013.01); *H01L 2225/06562* (2013.01); *H01L 2924/181* (2013.01)

(56) References Cited

U.S. PATENT DOCUMENTS

| | | | |
|---|---|---|---|
| 2004/0070042 A1* | 4/2004 | Lee | H01L 24/48 257/459 |
| 2011/0278736 A1* | 11/2011 | Lin | H01L 23/49816 257/774 |
| 2011/0304015 A1* | 12/2011 | Kim | H01L 23/552 257/532 |
| 2013/0249101 A1* | 9/2013 | Lin | H01L 23/5389 257/773 |
| 2013/0341784 A1* | 12/2013 | Lin | H01L 24/19 257/737 |
| 2015/0001708 A1* | 1/2015 | Lin | H01L 23/49811 257/737 |
| 2016/0118333 A1 | 4/2016 | Lin | |
| 2016/0260682 A1 | 9/2016 | Scanlan et al. | |
| 2016/0276311 A1 | 9/2016 | Meyer et al. | |
| 2016/0284642 A1 | 9/2016 | Ganesan et al. | |
| 2017/0250170 A1* | 8/2017 | Yu | H01L 25/18 |

FOREIGN PATENT DOCUMENTS

| | | |
|---|---|---|
| CN | 106373934 | 2/2017 |
| CN | 106463493 | 2/2017 |
| TW | 201426965 | 7/2014 |
| TW | 201539590 | 10/2015 |
| TW | 201618196 | 5/2016 |

OTHER PUBLICATIONS

"Office Action of Taiwan Counterpart Application," dated Aug. 20, 2019, p. 1-p. 10.

"Office Action of China Counterpart Application," dated Dec. 23, 2019, p. 1-p. 10.

"Office Action of China Counterpart Application", dated Jul. 1, 2020, p. 1-p. 10.

"Office Action of Taiwan Counterpart Application", dated Jul. 6, 2020, p. 1-p. 6.

* cited by examiner

PACKAGE STRUCTURE INCLUDING AT LEAST ONE CONNECTING MODULE AND MANUFACTURING METHOD THEREOF

CROSS REFERENCE TO RELATED APPLICATION

This application claims the priority benefit of U.S. provisional application Ser. No. 62/591,166, filed on Nov. 27, 2017. The entirety of the above-mentioned patent application is hereby incorporated by reference herein and made a part of specification.

BACKGROUND OF THE INVENTION

Field of the Invention

The disclosure generally relates to a package structure and a manufacturing method thereof, and in particular, to a package structure having a connecting module and a manufacturing method thereof.

Description of Related Art

Development of semiconductor package technology in recent years has focused on delivering products with smaller volume, lighter weight, higher integration level, and lower manufacturing cost. For multi-functional semiconductor packages, a technique for stacking chips has been used to provide the packages with a larger capacity to store or process data. The rapid increase in demand for multi-functional electronic components with the improved desired features has become a challenge to researchers in the field.

SUMMARY OF THE INVENTION

The disclosure provides a package structure and a manufacturing method thereof, which effectively reduces the height of the package structure at a lower manufacturing cost.

The disclosure provides a package structure including a redistribution structure, a die, at least one connecting module, a first insulating encapsulant, a chip stack, and a second insulating encapsulant. The die is disposed on and electrically connected to the redistribution structure. The connecting module is disposed on the redistribution structure. The connecting module has a protection layer and a plurality of conductive bars. The conductive bars are embedded in the protection layer. The protection layer includes a plurality of openings corresponding to the conductive bars. The first insulating encapsulant encapsulates the die and the connecting module. The chip stack is disposed on the first insulating encapsulant and the die. The chip stack is electrically connected to the connecting module. The second insulating encapsulant encapsulates the chip stack.

The disclosure provides a manufacturing method of a package structure. The method includes at least the following steps. A carrier is provided. A redistribution structure is formed on the carrier. A plurality of dies and a plurality of connecting modules are disposed on the redistribution structure. Each of the connecting modules has a protection layer and a plurality of conductive bars embedded in the protection layer. A first insulating encapsulant is formed to encapsulate the dies and the connecting modules. The carrier is removed from the redistribution structure. A plurality of openings is formed in the protection layer of the connecting modules. The openings correspond to the conductive bars. A chip stack is disposed on the dies and the first insulating encapsulant opposite to the redistribution structure. The chip stack is electrically connected to the connecting modules. The second insulating encapsulant encapsulates the chip stack.

Based on the above, the readily available prefabricated connecting module may serve as vertical connecting feature within the package structure. Due to the small thickness of the connecting module, the size of the package structure may be effectively reduced. In addition, the adaption of the connecting module may result in elimination of additional carrier or thicker copper pillars in the conventional package structure, thereby reducing the manufacturing cost.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles presented in the disclosure. Identical or similar numbers refer to identical or similar elements throughout the drawings.

FIG. 1A to FIG. 1K are schematic cross-sectional views illustrating a manufacturing method of a package structure according to some embodiments of the disclosure.

DESCRIPTION OF THE EMBODIMENTS

Figure 1A:

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1K are schematic cross-sectional views illustrating a manufacturing method of a package structure 10 according to some embodiments of the disclosure. Referring to FIG. 1A, a carrier 100 having a de-bonding layer 102 formed thereon is provided. The carrier 100 may be a glass substrate or a glass supporting board. However, they construe no limitation in the disclosure. Other suitable substrate material may be adapted as long as the material is able to withstand subsequent processes while structurally supporting the package structure formed thereon. The de-bonding layer 102 may include light to heat conversion (LTHC) materials, epoxy resins, inorganic materials, organic polymeric materials, or other suitable adhesive materials. However, the disclosure is not limited thereto, and other suitable de-bonding layers may be used in some alternative embodiments.

Figure 1B:
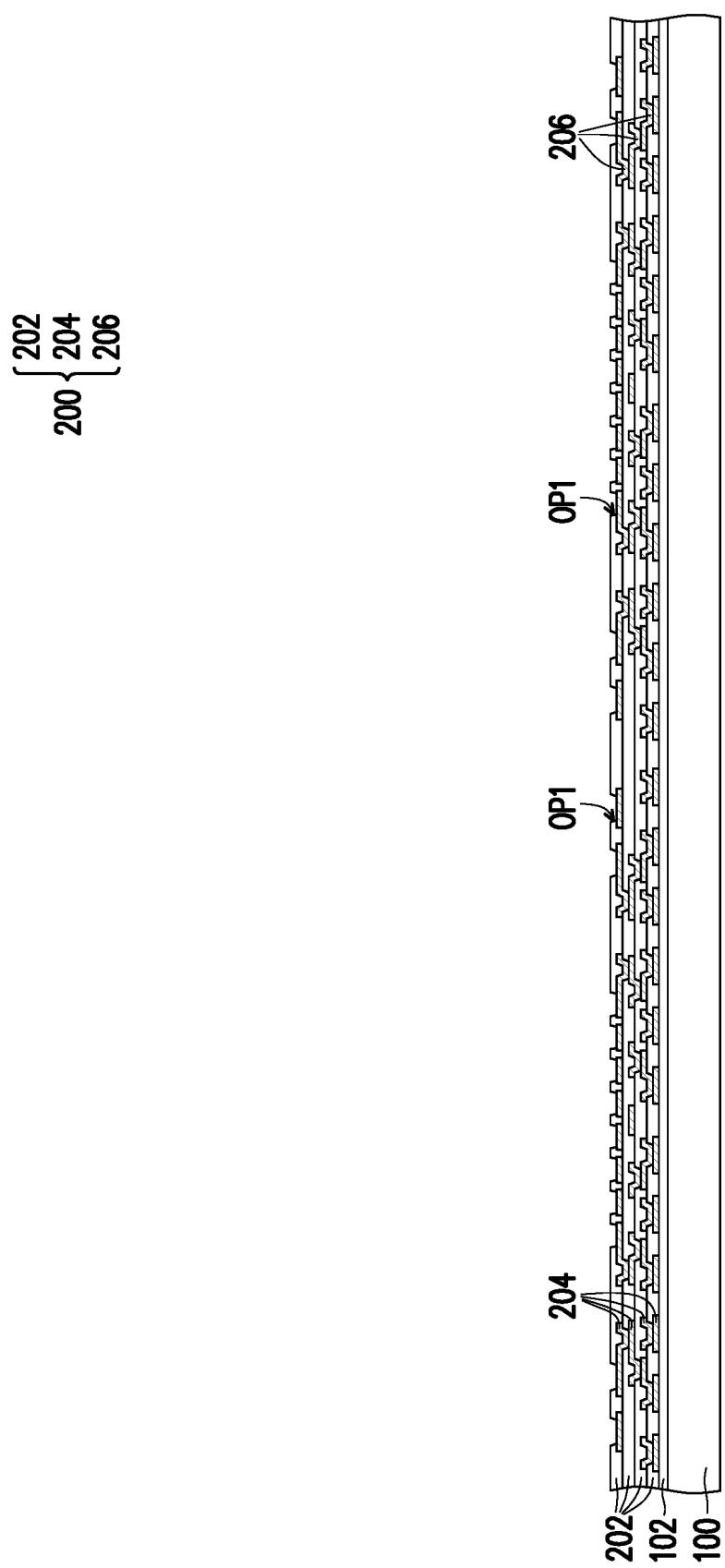

Referring to FIG. 1B, a redistribution structure 200 is formed on the carrier 100. The redistribution structure 200 may include at least one dielectric layer 202, a plurality of conductive patterns 204, and a plurality of conductive vias 206. The dielectric layers 202 may be formed by suitable fabrication techniques such as spin-on coating, chemical vapor deposition (CVD), plasma-enhanced chemical vapor deposition (PECVD), or the like. The dielectric layers 202 may be made of non-organic or organic dielectric materials such as silicon oxide, silicon nitride, silicon carbide, silicon oxynitride, polyimide, benzocyclobutene (BCB), or the like. The conductive patterns 204 and the conductive vias 206 may be formed by sputtering, evaporation, electro-less plating, or electroplating. The conductive patterns 204 and the conductive vias 206 are embedded in the dielectric layers 202. The dielectric layers 202 and the conductive patterns 204 may be alternatingly formed. The conductive vias 206 penetrate through the dielectric layers 202 to electrically connect the conductive patterns 204 to each other. The conductive patterns 204 and the conductive vias 206 may be made of copper, aluminum, nickel, gold, silver, tin, a combination thereof, a composite structure of copper/nickel/gold, or other suitable conductive materials.

In the exemplary embodiment of FIG. 1B, the redistribution structure 200 includes four dielectric layers 202. However, the number of the dielectric layers 202 is not limited and may be adjusted based on circuit design. The top dielectric layer 202 may have a plurality of openings OP1 exposing the top conductive patterns 204 for electrical connection in the subsequent processes. The bottom dielectric layer 202 exposes part of the bottom conductive patterns 204 such that the bottom conductive patterns 204 may be interconnected to other conductive patterns 204 through the conductive vias 206.

Figure 1C:
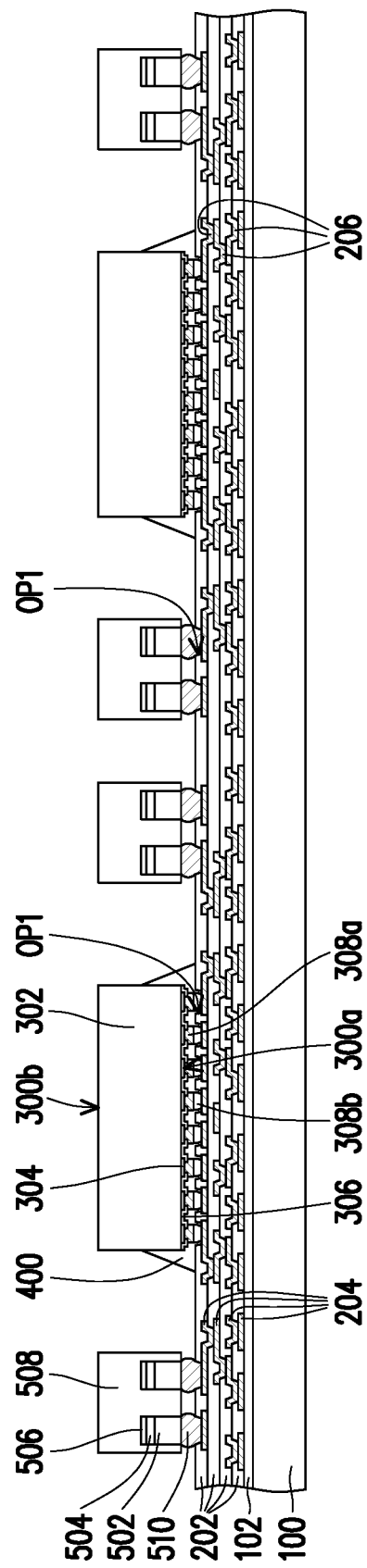
Figure 1D:
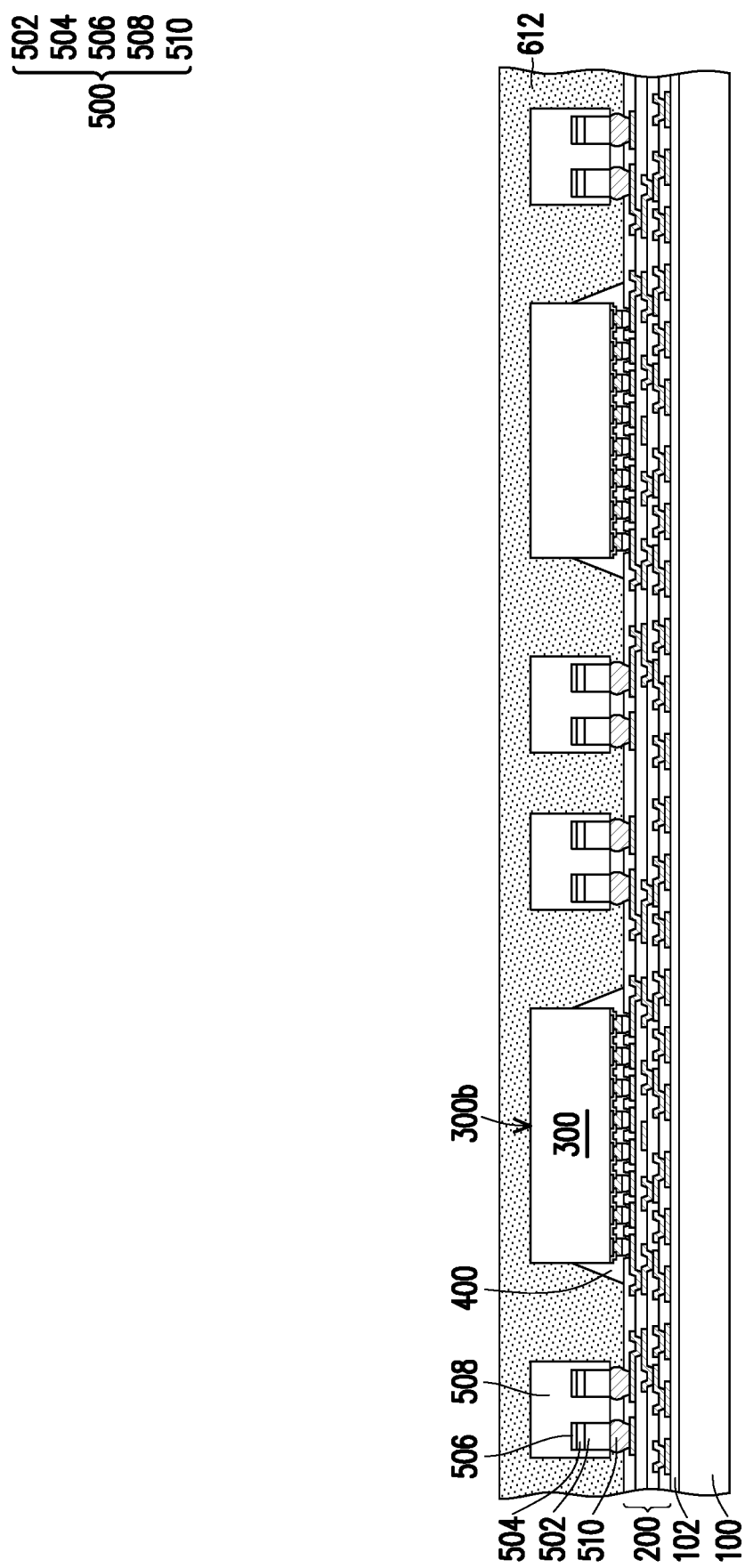

Referring to FIG. 1C, a plurality of dies 300 and a plurality of connecting modules 500 are disposed on the redistribution structure 200. The dies 300 may include digital dies, analog dies, or mixed signal dies. For example, the dies 300 may be application-specific integrated circuit (ASIC) dies, logic dies, or other suitable dies. Each die 300 includes a semiconductor substrate 302, a plurality of conductive pads 304, a passivation layer 306, and a plurality of conductive connectors 308. In some embodiments, the semiconductor substrate 302 may be a silicon substrate including active components (e.g., transistors or the like) and, optionally, passive components (e.g., resistors, capacitors, inductors, or the like) formed therein. The conductive pads 304 are distributed over the semiconductor substrate 302. The conductive pads 304 may include aluminum pads, copper pads, or other suitable metal pads. The passivation layer 306 is formed over the semiconductor substrate 302 to partially cover each connection pad 304. In other words, the passivation layer 306 has a plurality of contact openings revealing at least a portion of each connection pad 304. The passivation layer 306 may be a silicon oxide layer, a silicon nitride layer, a silicon oxy-nitride layer, or a dielectric layer formed of polymeric materials or other suitable dielectric materials. The conductive connectors 308 are disposed on the conductive pads 304. For example, the conductive connectors 308 may be partially disposed in the contact openings of the passivation layer 306 to render electrical connection with the conductive pads 304. In some embodiments, each conductive connector 308 may include a conductive post 308a and a conductive bump 308b disposed on the conductive post 308a. The conductive post 308a may be plated onto the conductive pads 304. The plating process is, for example, electro-plating, electroless-plating, immersion plating, or the like. The conductive posts 308a may include copper, copper alloys, or the like. The conductive bump 308b may be made of copper, nickel, tin, silver, or a combination thereof. In some embodiments, the conductive posts 308a may be omitted. In other words, the conductive connectors 308 may include C2 (Chip Connection) bump or C4 (Controlled Collapse Chip Connection) bumps.

In some embodiments, each die 300 has an active surface 300a and a rear surface 300b opposite to the active surface 300a. As illustrated in FIG. 1C, the dies 300 are disposed in a face down manner such that the active surfaces 300a of the dies 300 face toward the redistribution structure 200. The dies 300 may be electrically connected to the redistribution structure 200 through flip-chip bonding. For example, the conductive connectors 308 of the dies 300 may be disposed within a portion of the openings OP1 of the top dielectric layer 202 to be directly in contact with the top conductive patterns 204 of the redistribution structure 200. As such, the electrical connection between the dies 300 and the redistribution structure 200 may be achieved. The redistribution structure 200 may be used to reroute electrical signals to/from the die 300 and may expand in a wider area than the die 300. Therefore, in some embodiments, the redistribution structure 200 may be referred to as a "fan-out redistribution structure."

In some embodiments, an underfill 400 is formed between the redistribution structure 200 and the die 300 to protect and isolate the coupling between the conductive connectors 308 and the top conductive pads 204. In some embodiments, the underfill 400 fills into the openings OP1 of the top dielectric layer 202. The underfill 400 may be formed by a capillary underfill (CUF) and may include polymeric materials, resins, or silica additives.

In the exemplary embodiment of FIG. 1C, the connecting modules 500 are disposed to surround the dies 300. Each of the connecting modules 500 includes a plurality of conductive bars 502, a plurality of barrier layers 504, a plurality of conductive caps 506, and a protection layer 508. The conductive bars 502 may be shaped as cylindrical columns. However, the disclosure is not limited thereto. In some alternative embodiments, the conductive bars 502 may take the form of polygonal columns or other suitable shapes. A material of the conductive bars 502 includes copper, aluminum, nickel, tin, gold, silver, alloys thereof, or the like. The conductive caps 506 are correspondingly disposed on the conductive bars 502 to further enhance the electrical connection and the wire bondability of the connecting modules 500 with other subsequently formed elements. In some embodiments, a material of the conductive caps 506 is different from the material of the conductive bars 502. For example, the conductive caps 506 may include gold or other metallic material with excellent electrical conductivity and good wire bondability. In some embodiments, the barrier layer 504 may include nickel, solder, silver, or other suitable conductive materials. Each barrier layer 504 is sandwiched between a conductive cap 506 and a conductive bar 502 to prevent diffusion of atoms between the conductive cap 506 and the conductive bar 502. For example, when the conductive bar 502, the barrier layer 504, and the conductive cap 506 are respectively made of copper, nickel, and gold, the barrier layer 504 formed of nickel may prevent the copper atoms of the conductive bar 502 from diffusing into the conductive cap 506. The contamination of the conductive cap 506 with copper would cause the conductive cap 506 to oxidize easily, thereby resulting in poor wire bondability. However, with the aid of the barrier layer 504, the foregoing adverse effect may be sufficiently prevented. In some embodiments, the conductive caps 506 and the barrier layers 504 may be omitted if the conductive bars 502 already have sufficient wire bondability with the subsequently formed elements.

In the exemplary embodiment of FIG. 1C, the conductive bars 502, the barrier layers 504, and the conductive caps 506 are embedded in the protection layer 508. In other words, the conductive bars 502, the barrier layers 504, and the conductive caps 506 are protected by the protection layer 508 from external elements. A material of the protection layer 508 may include polymers, epoxies, molding compounds, or other suitable dielectric materials.

In some embodiments, each connecting module 500 may further include a plurality of conductive bumps 510. The conductive bumps 510 are correspondingly disposed on the conductive bars 502. The conductive bumps 510 are disposed on a surface of the conductive bars 502 facing away from the conductive caps 506. The conductive bumps 510 may include solder bumps or the like. The conductive bumps 510 may be disposed within another portion of the openings OP1 of the redistribution layer 200 to form electrical connection between the connecting module 500 and the redistribution structure 200. The conductive bumps 510 may be sandwiched between the conductive bars 502 and the redistribution structure 200.

In some embodiments, the connecting modules 500 are pre-fabricated before being placed on the redistribution structure 200. In some embodiments, the connecting modules 500 may be picked-and-placed onto the redistribution structure 200 by a die bonder, a chip sorter, or a SMT (Surface Mount Technology) machine. A number of the conductive bars 502 within each connecting module 500 may vary depending on design requirements. The configuration of the connecting modules 500 will be discussed below in conjunction with FIG. 2A to FIG. 2D.

Figure 2B:
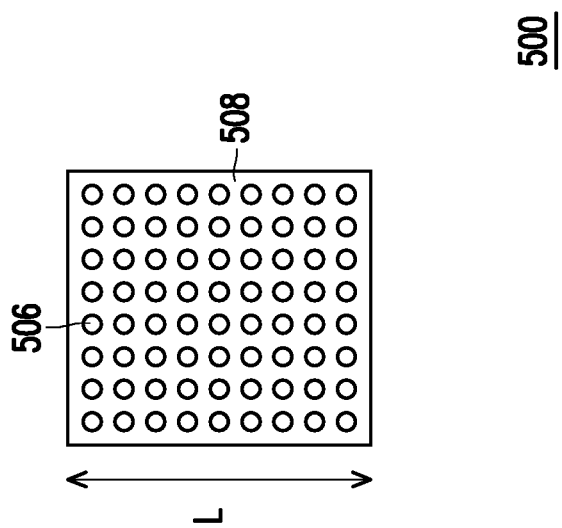
FIG. 2A to FIG. 2D are schematic top views illustrating the connecting module in FIG. 1C in accordance with various embodiments of the disclosure.
Figure 2A:
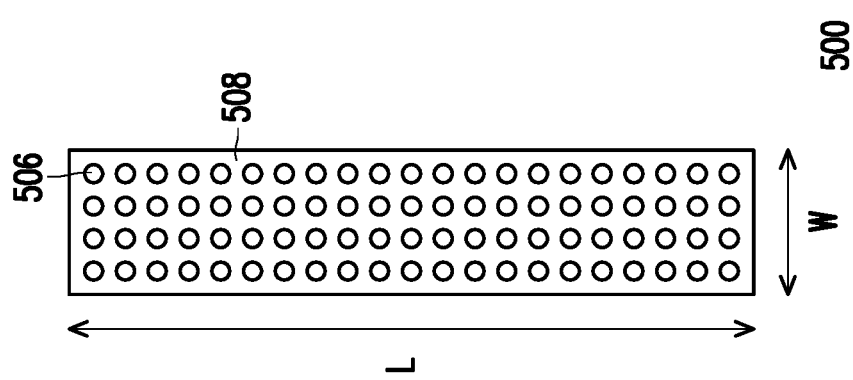

FIG. 2A to FIG. 2D are schematic top views illustrating the connecting module 500 in FIG. 1C in accordance with various embodiments of the disclosure. Referring to FIG. 2A, each connecting module 500 may exhibit a rectangular shape from the top view. In some embodiments, the connecting module 500 has a length L of 5 mm to 15 mm and a width W of 1.5 mm to 2 mm. As illustrated in FIG. 2A, the conductive bars 502 are distributed within the protection layer 508 such that a distance between conductive bars 502 is minimized while maintaining effective electrical isolation between the conductive bars 502. When the connecting modules 500 are rectangular, multiple connecting modules 500 may be picked-and-placed onto the redistribution structure 200 to surround four sides of each die 300.

Referring to FIG. 2B, each connecting module 500 may exhibit a square shape from the top view. In some embodiments, a length L of each side of the connecting module 500 may range between 5 mm and 15 mm. When the connecting modules 500 are squared, multiple connecting modules 500 may be picked-and-placed onto the redistribution structure 200 to surround four sides of each die 300.

Figure 2C:
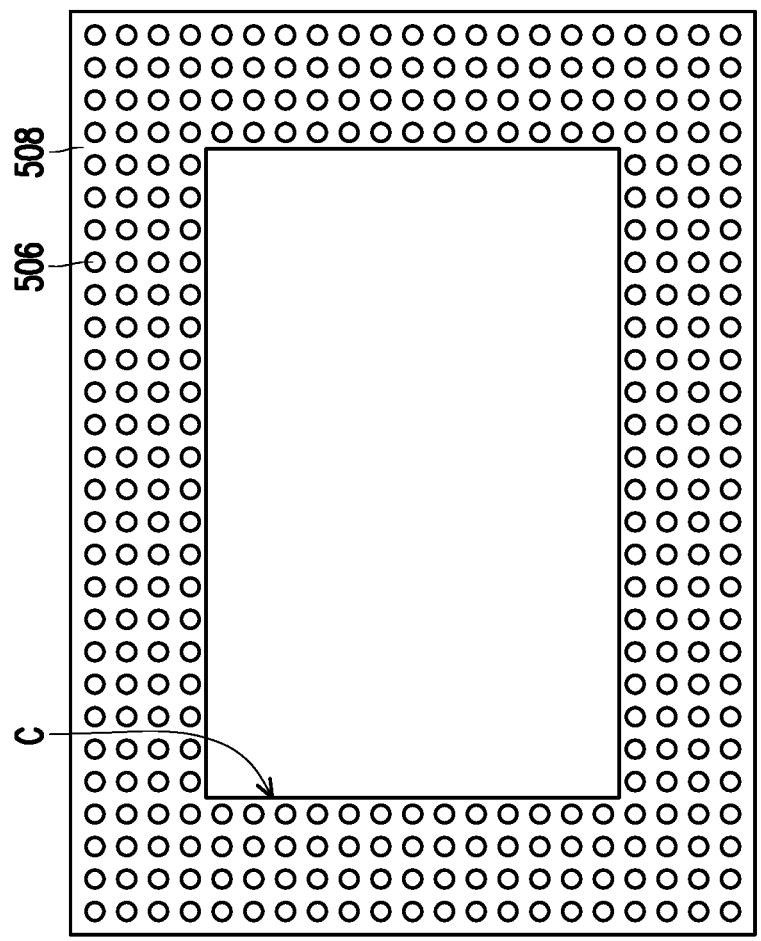

Referring to FIG. 2C, each connecting module 500 may be a ring shape from the top view. In other words, a cavity C may be enclosed by the connecting module 500 to accommodate the die 300. In some embodiments, the cavity C may accommodate one die 300. That is, multiple connecting modules 500 may be picked-and-placed onto the redistribution structure 200 to surround different dies 300.

Figure 2D:
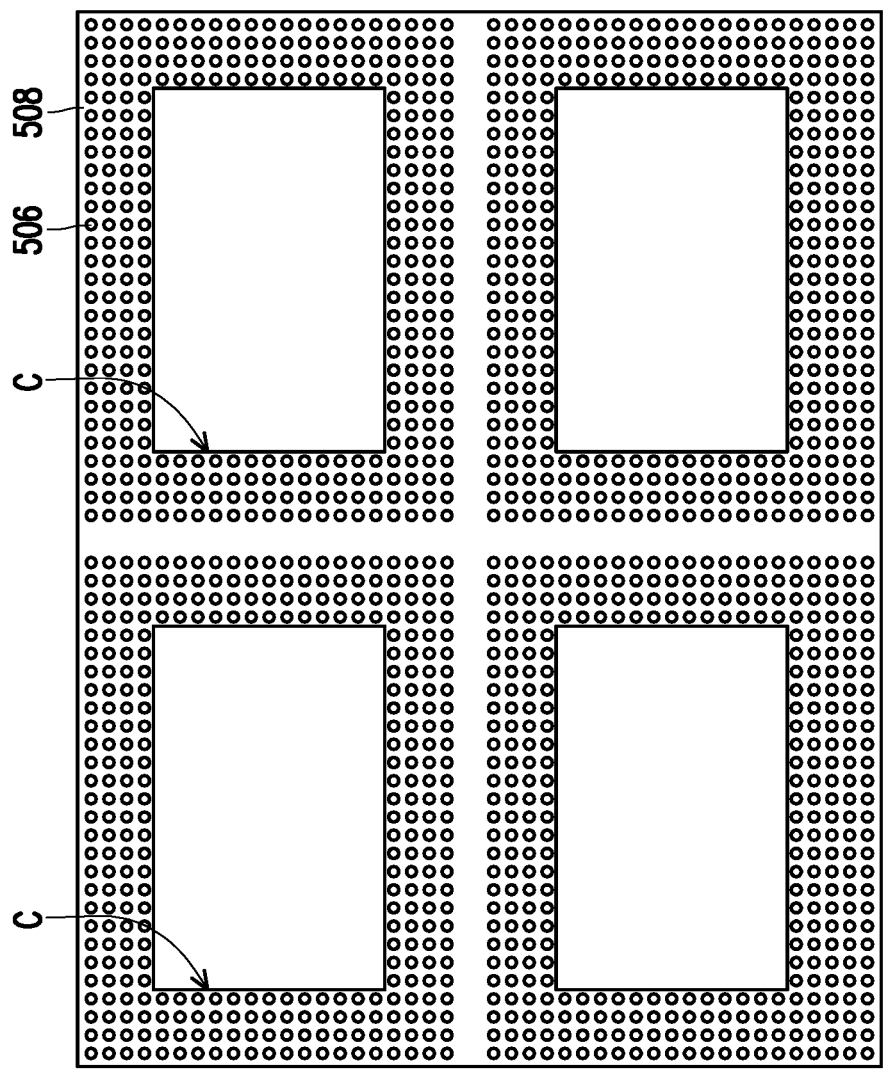

Referring to FIG. 2D, each connecting module 500 may enclose a plurality of cavities C. In some embodiments, each cavity C may accommodate one die 300. That is, one connecting modules 500 may be picked-and-placed onto the redistribution structure 200 to surround multiple dies 300, so as to achieve batch production.

Referring back to FIG. 1D, an insulating material 612 is formed on the redistribution structure 200 to encapsulate the dies 300, the underfill 400, and the connecting modules 500. A material of the insulating material 612 may be different from the material of the protection layer 508 of the connecting modules 500. For example, the insulating material 612 may include a molding compound formed by a molding process or an insulating material such as epoxy, silicone, or other suitable resins.

Figure 1E:
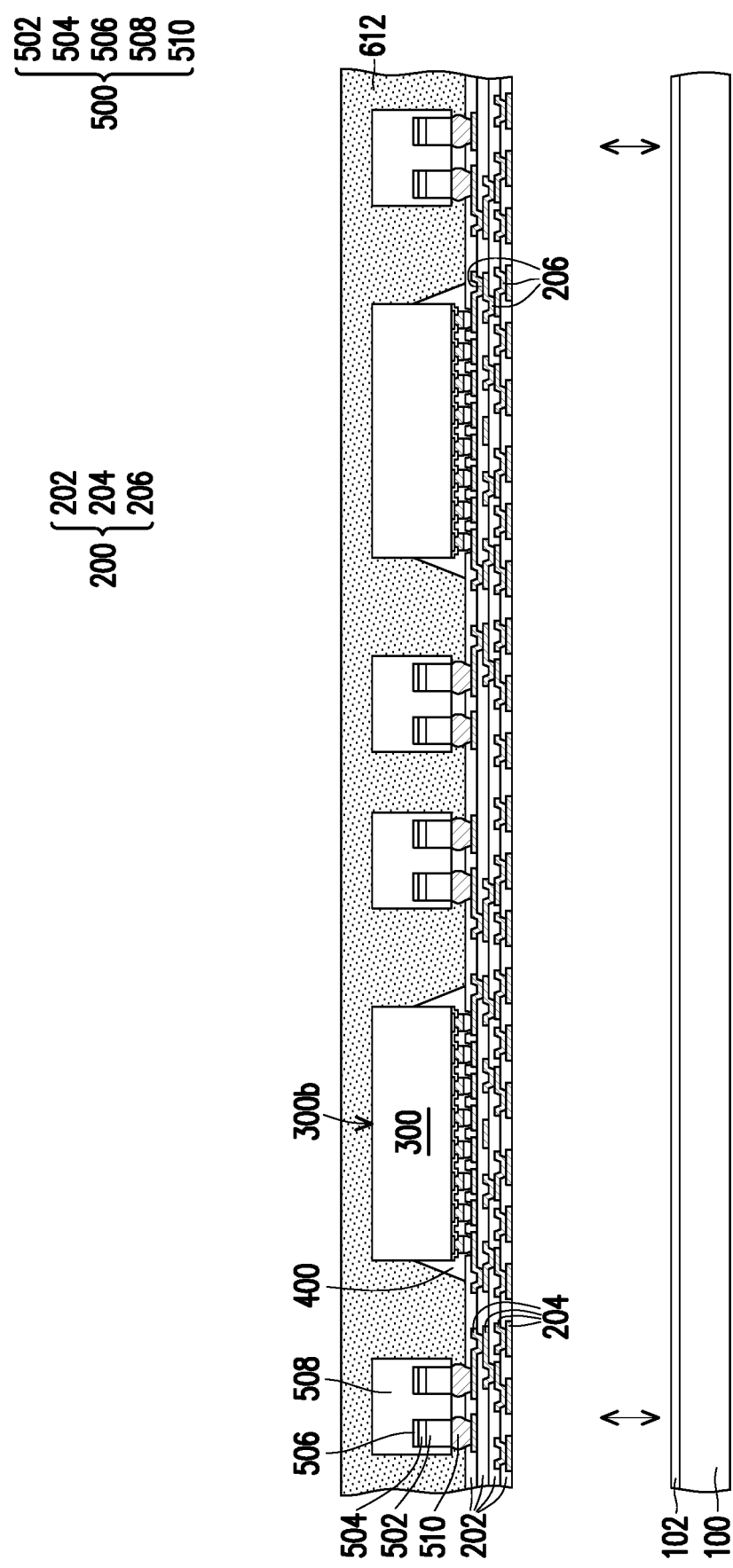

Referring to FIG. 1E, after forming the insulating material 612, the de-bonding layer 102, and the carrier 100 are removed from the redistribution structure 200. As mentioned above, the de-bonding layer 102 may be an LTHC layer. Upon exposure to a UV laser light, the de-bonding layer 102 and the carrier 100 may be peeled off and separated from the bottom dielectric layer 202 and the bottom conductive patterns 204 of the redistribution structure 200. In some embodiments, after the de-bonding layer 102 and the carrier 100 are removed, the structure illustrated in FIG. 1E may be sawed into strip form for conventional wire bonding assembly.

Figure 1F:
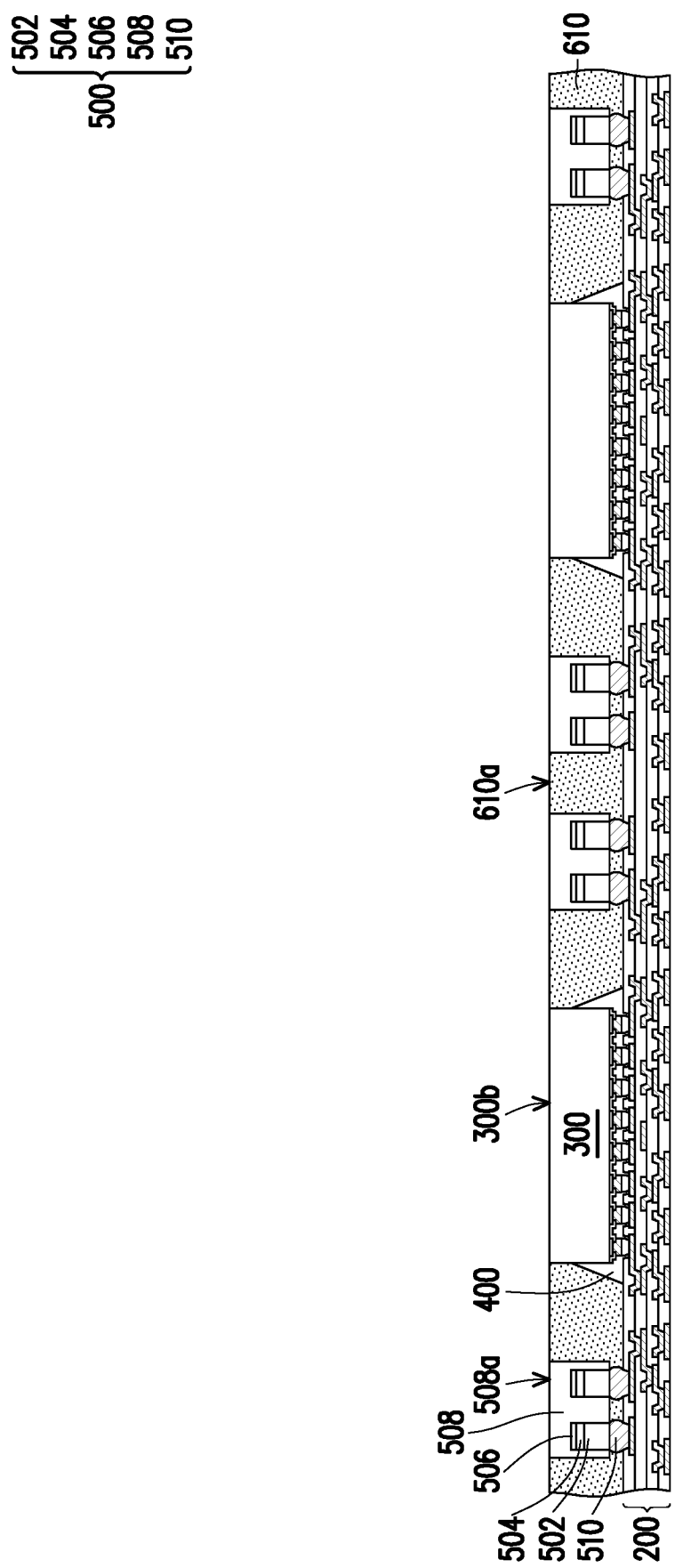

Referring to FIG. 1F, a thickness of the insulating material 612 is reduced to form a first insulating encapsulant 610. A portion of the insulating material 612 may be removed to expose the protection layer 508 of the connecting modules 500 and, optionally, the rear surfaces 300b of the dies 300. Meanwhile, the conductive caps 506 are still well protected by the protection layer 508. In some embodiments, the insulating material 612 may be removed through a planarization process. The planarization process includes, for example, Chemical Mechanical Polishing (CMP), mechanical grinding, etching, or other suitable process. In some embodiments, after the protection layer 508 of the connecting modules 500 and the rear surfaces 300b of the dies 300 are exposed, the connecting modules 500, the insulating material 612, and the dies 300 may be further grinded to reduce the overall thickness of the subsequently formed package structure 10. After the planarization process, the first insulating encapsulant 610 is disposed on the redistribution structure 200 to laterally encapsulate the dies 300 and the connecting modules 500. In some embodiments, top surfaces 508a of the protection layer 508, a top surface 610a of the first insulating encapsulant 610, and the rear surfaces 300b of the dies 300 are substantially coplanar to each other. As mentioned above, since the first insulating encapsulant 610 and the protection layer 508 of the connecting modules 500 are made of different materials, these two layers are considered as two distinct layers. In other words, a clear interface may be seen between these two elements. It should be noted that in some alternative embodiments, the thinning process may be performed before the de-bonding process shown in FIG. 1E.

Figure 1G:
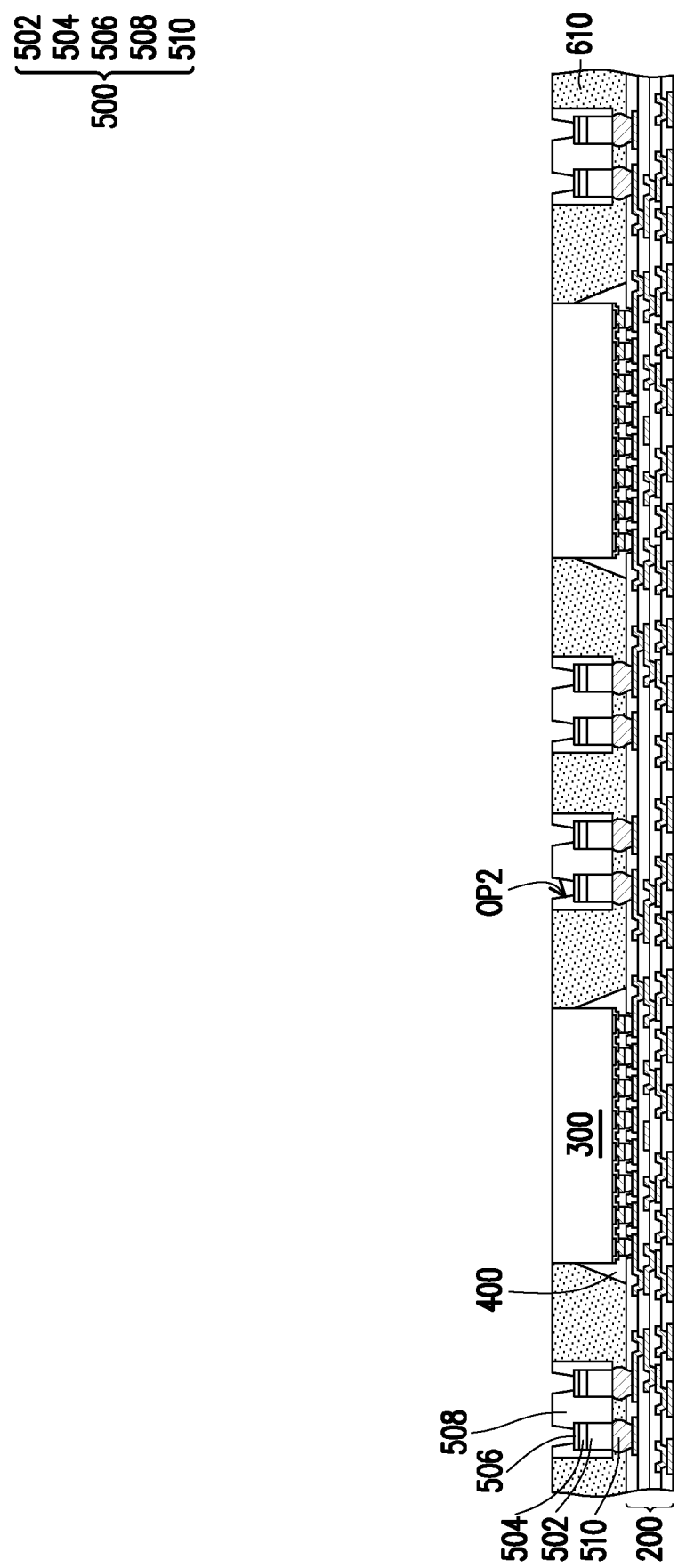

Referring to FIG. 1G, a plurality of openings OP2 is formed in the protection layer 508 of the connecting modules 500. In some embodiments, the openings OP2 are formed through a laser drilling process. For example, the protection layer 508 located directly above the conductive caps 506 may be partially removed to render the openings OP2. In other words, locations of the openings OP2 correspond to locations of the conductive caps 506, the barrier layer 504, and the conductive bars 502. Each of the openings OP2 expose at least a portion of each of the conductive caps 506 of the connecting modules 500.

Figure 1H:
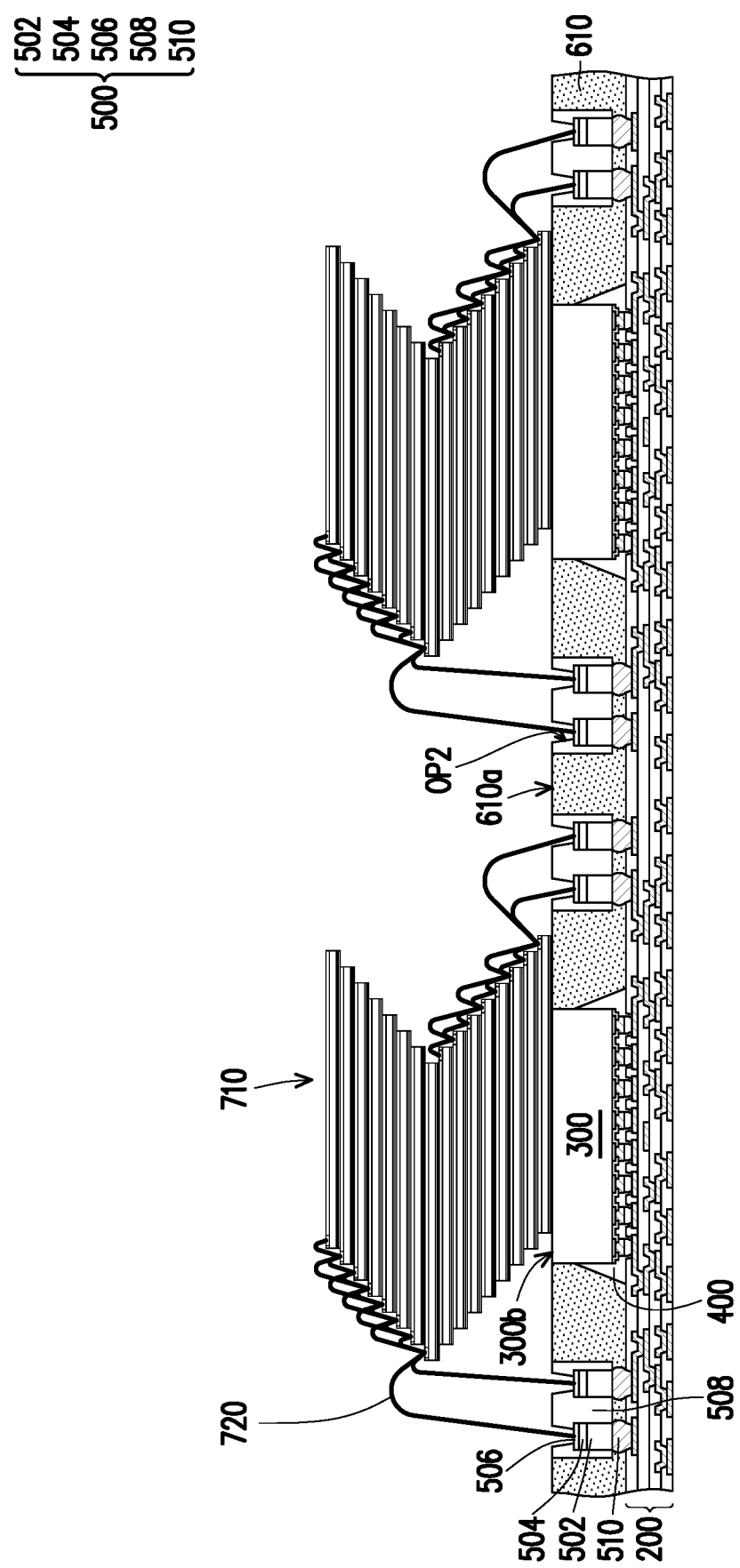
Figure 11:
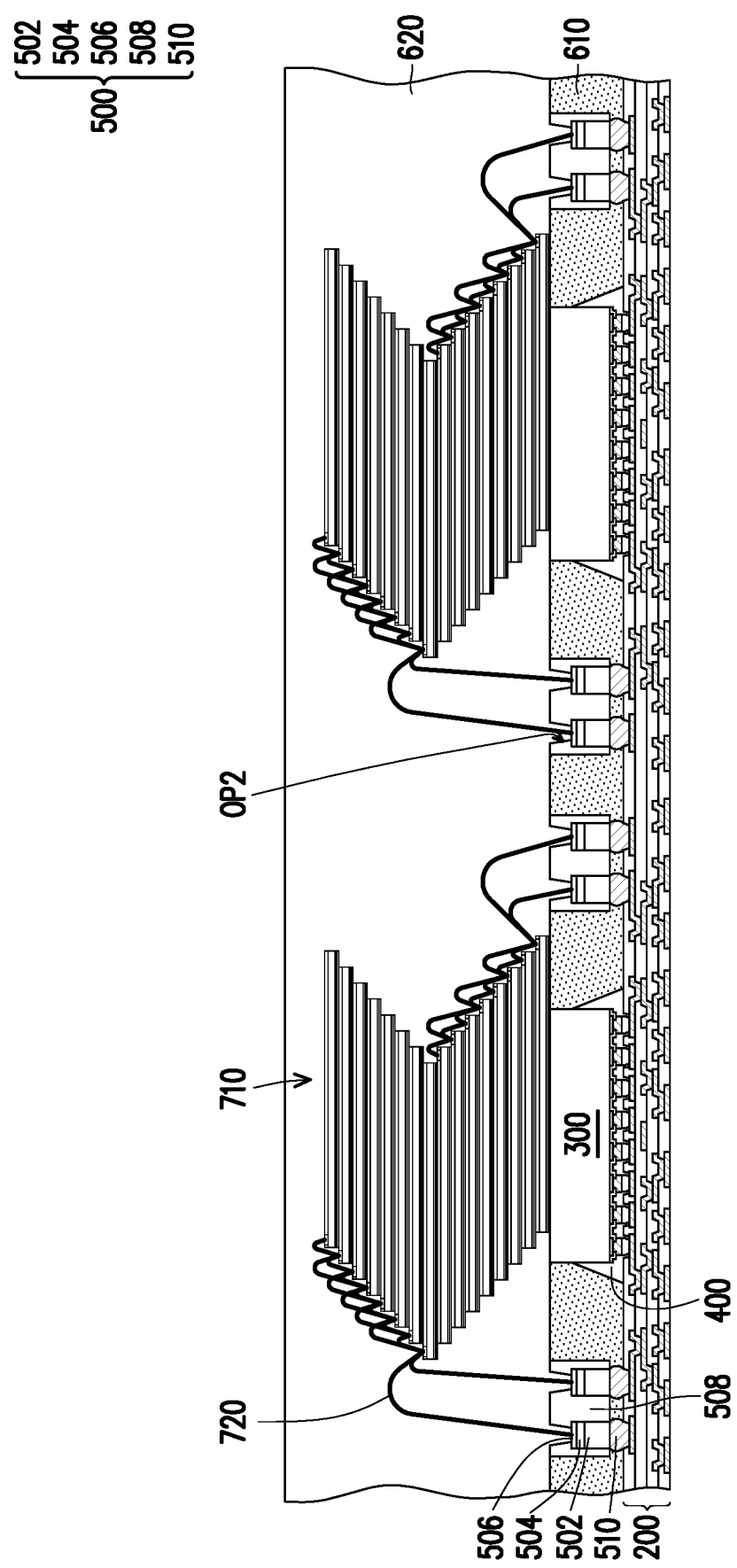

Referring to FIG. 1H, a chip stack 710 is disposed on the dies 300 and the first insulating encapsulant 610 opposite to the redistribution structure 200. The chip stack 710 may be placed on the rear surfaces 300b of the dies 300 and the top surface 610a of the first insulating encapsulant 610. In some embodiments, the chip stack 710 may be constituted by a plurality of chips stacked on each other. The chips may include memory chips having non-volatile memory, such as NAND flash. However, the disclosure is not limited thereto.

In some alternative embodiments, the chips of the chip stack 710 may be chips capable of performing other functions, such as logic function, computing function, or the like. A chip attachment layer may be seen between two adjacent chips in the chip stack 710 to enhance the adhesion between these two chips.

The chip stack 710 may be electrically connected to the conductive caps 506 of the connecting modules 500 through a plurality of conductive wires 720. For example, after the chip stack 710 is disposed on the dies 300 and the first insulating encapsulant 610, a plurality of conductive wires 720 may be formed through a wire-bonding process. One end of the conductive wire 720 is connected to at least one chip of the chip stack 710. On the other hand, another end of the conductive wire 720 extends into the openings OP2 of the protection layer 508 to connect with the conductive cap 506. A material of the conductive wires 720 may include gold, aluminum, or other suitable conductive materials. In some embodiments, the material of the conductive wires 720 is identical to the material of the conductive caps 506.

Referring to FIG. 1I, a second insulating encapsulant 620 is formed on the first insulating encapsulant 610 and the connecting modules 500 to encapsulate the chip stack 710 and the conductive wires 720. A material of the second insulating encapsulant 620 may be the same or different from that of the first insulating encapsulant 610. For example, the material of the second insulating encapsulant 620 may include epoxy, molding compound, or other suitable insulating materials. In some embodiments, the material of the second insulating encapsulant 620 may have a low moisture absorption rate. The second insulating encapsulant 620 may be formed through compression molding, transfer molding, or other encapsulation processes. As illustrated in FIG. 1I, the second insulating encapsulant 620 fills into the openings OP2 of the protection layer 508 of the connecting modules 500 to protect segments of the conductive wires 720 located in the openings OP2. The second insulating encapsulant 620 provides physical support, mechanical protection, and electrical and environmental isolation for the chip stack 710 and the conductive wires 720. In other words, the chip stack 710 and the conductive wires 720 are embedded in the second insulating encapsulant 620.

Figure 1J:
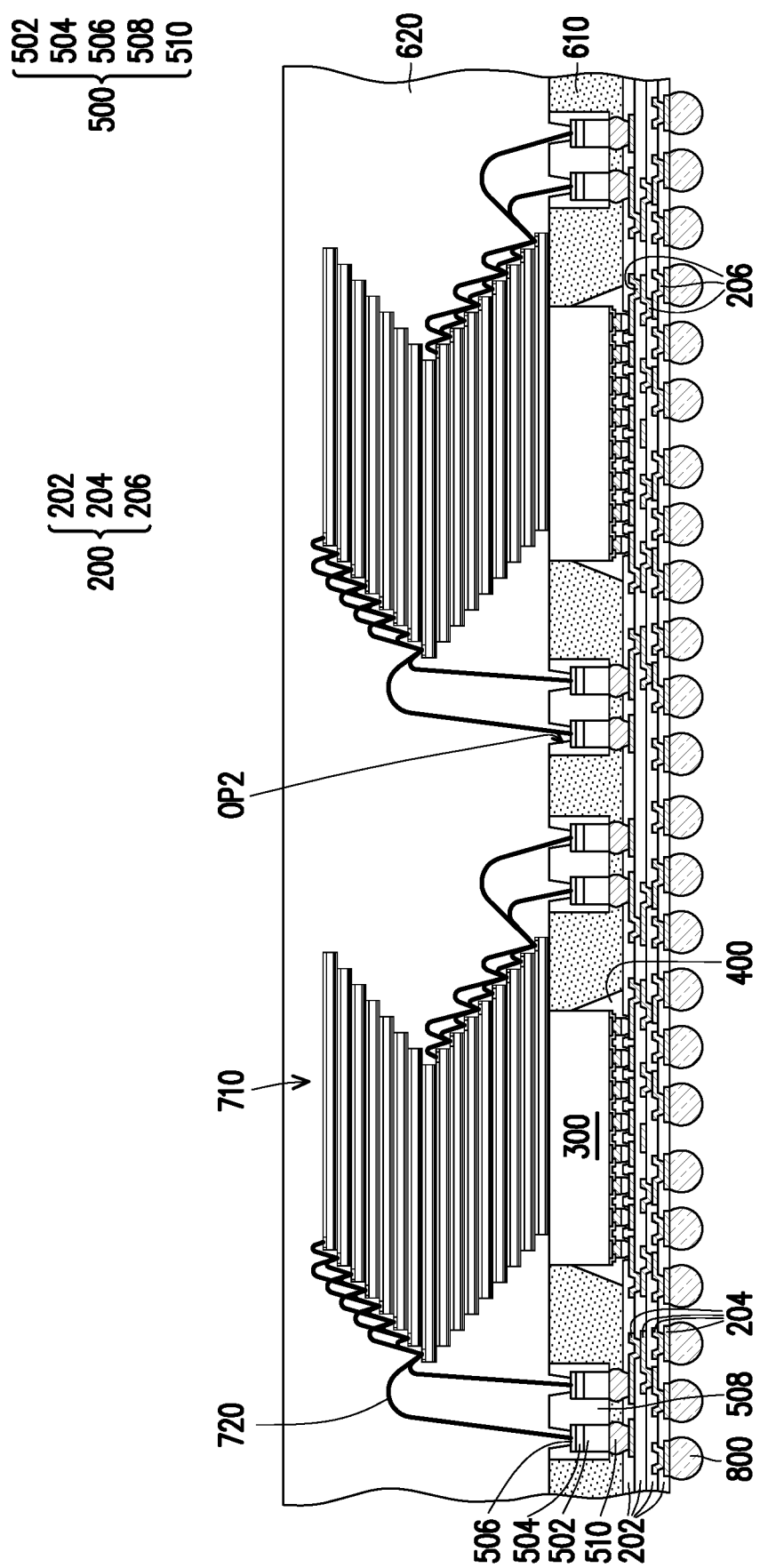

Referring to FIG. 1J, a plurality of conductive terminals 800 is formed on the redistribution structure 200 opposite to the dies 300 and the connecting modules 500. In some embodiments, the conductive terminals 800 are disposed on the bottom conductive patterns 204 of the redistribution structure 200. In other words, the bottom conductive patterns 204 of the redistribution structure 200 may be referred to as under-ball metallization (UBM) patterns. The conductive terminals 800 may be formed by a ball placement process and/or a reflow process. The conductive terminals 800 may be conductive bumps such as solder balls. However, the disclosure is not limited thereto. In some alternative embodiments, the conductive terminals 800 may take other possible forms and shapes based on design requirements. For example, the conductive terminals 800 may take the form of conductive pillars or conductive posts.

Figure 1K:
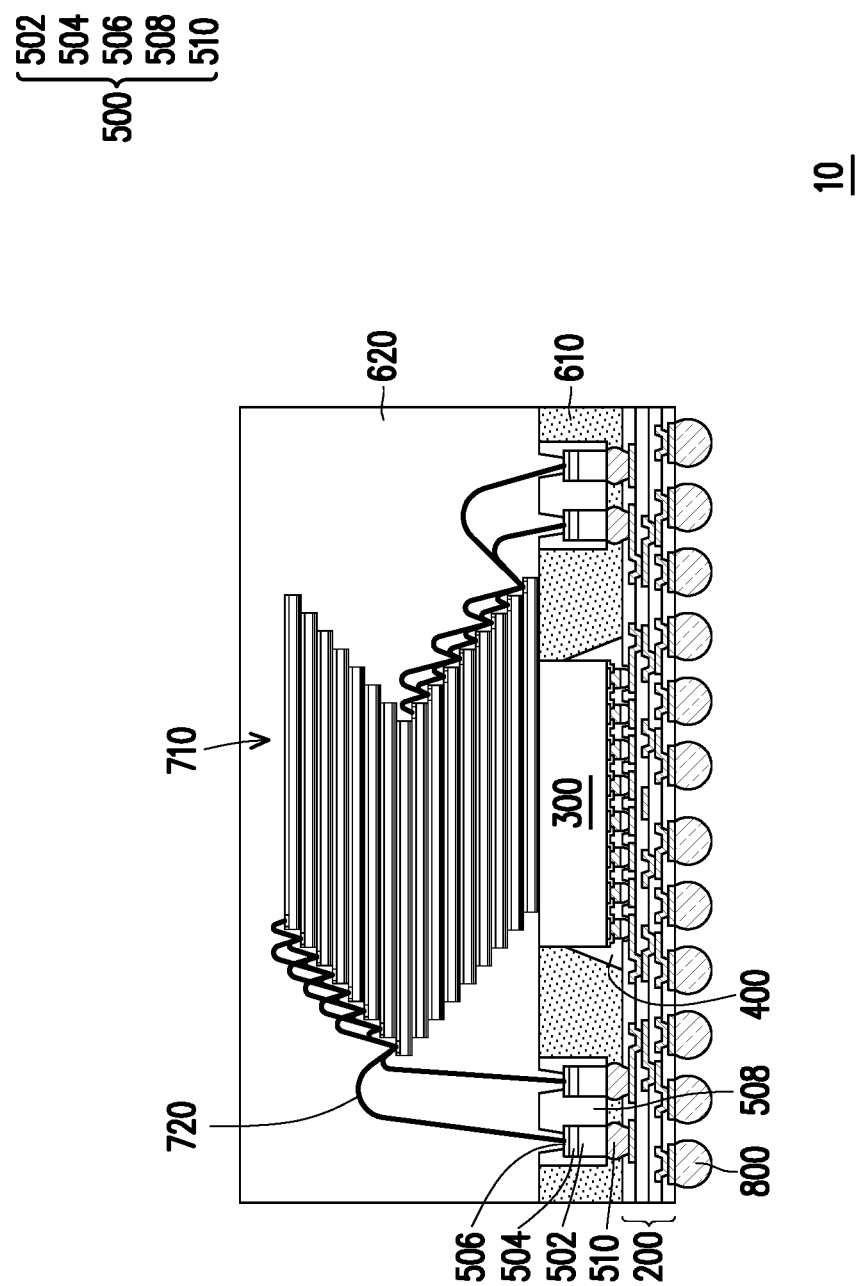

Referring to FIG. 1K, after forming the conductive terminals 800, a singulation process is performed to obtain a plurality of package structures 10. The singulation process includes, for example, cutting with a rotating blade or a laser beam.

By using readily available prefabricated connecting module 500 as vertical connecting feature within the package structure 10, the size of the package structure 10 may be effectively reduced due to the small thickness of the connecting module 500. In addition, the adaption of the connecting module 500 may result in elimination of additional carrier or thicker copper pillars in the conventional package structure, thereby reducing the manufacturing cost.

Figure 3:
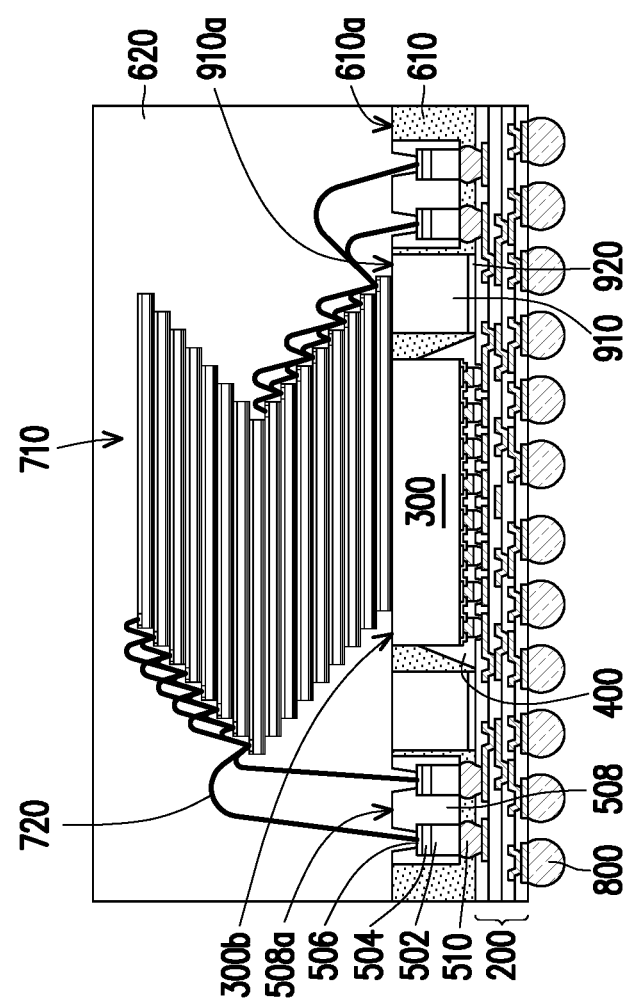
FIG. 3 is a schematic cross-sectional view illustrating a package structure according to some alternative embodiments of the disclosure.

FIG. 3 is a schematic cross-sectional view illustrating a package structure 20 according to some alternative embodiments of the disclosure. Referring to FIG. 3, the package structure 20 in FIG. 3 is similar to the package structure 10 in FIG. 1K, so similar elements are denoted by the same reference numeral and the detailed descriptions thereof are omitted herein. The difference between the package structure 20 in FIG. 3 and the package structure 10 in FIG. 1K lies in that the package structure 20 further includes a plurality of dummy dies 910 disposed between the dies 300 and the connecting modules 500. The dummy dies 910 may be disposed on the redistribution structure 200 prior to the formation of the first insulating encapsulant 610. The dummy dies 910 may be placed on the redistribution structure 200 through a picked-and-placed process. As illustrated in FIG. 3, the top surface 610a of the first insulating encapsulant 610, top surfaces 910a of the dummy dies 910, rear surface 300b of the die 300, and the top surfaces 508a of the protection layer 508 are substantially coplanar to each other.

In some embodiments, the dummy dies 910 are electrically floating. The dummy dies 910 may be electrically insulated from the redistribution structure 200, the die 300, the connecting modules 500, and the chip stack 710. In some embodiments, the dummy dies 910 may be free of active devices. In other words, the dummy dies 910 may not contribute to the operation of the package structure 20.

In some embodiments, each dummy die 910 may be adhered to the redistribution structure 200 through an adhesive layer 920. For example, the adhesive layer 920 may be disposed between the dummy dies 910 and the redistribution structure 200. The adhesive layer 920 may protect the redistribution structure 200 from indentation due to placement of the dummy dies 910 and may minimize shifting of the dummy dies 910 on the redistribution structure 200. In some embodiments, the adhesive layer 920 may include a die attachment film (DAF) or other similar materials.

In some embodiments, the dummy dies 910 may serve as a spacer if the size of the die 300 is smaller than the chip stack 710. That is, the dummy dies 910 may be used to provide extra physical support for the chip stack 710. It should be noted that although two dummy dies 910 are illustrated in FIG. 3, the disclosure is not limited thereto. The number of the dummy dies 910 may be adjusted based on the sizes of the chip stack 710 and the die 300.

Based on the above, the readily available prefabricated connecting module may serve as vertical connecting feature within the package structure. Due to the small thickness of the connecting module, the size of the package structure may be effectively reduced. In addition, the adaption of the connecting module may result in elimination of additional carrier or thicker copper pillars in the conventional package structure, thereby reducing the manufacturing cost.

It will be apparent to those skilled in the art that various modifications and variations can be made to the embodiments and concepts disclosed herein without departing from the scope or spirit of the invention. In view of the foregoing, it is intended that the present disclosure cover modifications and variations of this invention provided they fall within the scope of the following claims and their equivalents.

What is claimed is:

1. A package structure, comprising:
   a redistribution structure, comprising:

a conductive pattern; and
a dielectric layer, disposed on the conductive pattern and having a plurality of first openings to expose the conductive pattern;
a die disposed on and electrically connected to the redistribution structure;
at least one connecting module disposed on the redistribution structure, the connecting module having a protection layer, a plurality of conductive caps, a plurality of barrier layers, a plurality of conductive bars, and a plurality of conductive bumps, wherein:
the plurality of conductive caps, the plurality of barrier layers, and the plurality of conductive bars are embedded in the protection layer;
the protection layer comprises a plurality of second openings;
one of the plurality of conductive caps, one of the plurality of barrier layers, one of the plurality of conductive bars, and one of the plurality of conductive bumps are disposed corresponding to each of the plurality of second openings;
the plurality of second openings of the protection layer exposes at least a portion of each conductive cap;
the plurality of conductive bars are disposed on and directly contact the plurality of conductive bumps;
the plurality of barrier layers are disposed on and directly contact the plurality of conductive bars;
the plurality of conductive caps are disposed on and directly contact the plurality of barrier layers;
a material of the conductive bars is different from a material of the conductive caps;
the material of the conductive bars comprises copper;
the material of the conductive caps does not comprise copper; and
the plurality of conductive bumps are embedded within the plurality of first openings of the dielectric layer to directly contact to the conductive pattern and a side wall of the plurality of first openings;
a first insulating encapsulant surrounding the die and the connecting module wherein a portion of the first insulating encapsulant is disposed between the redistribution structure and the connecting module to directly contact a portion of the side wall of the plurality of conductive bumps, and there is no interface in the first insulating encapsulant;
a chip stack disposed on the first insulating encapsulant and the die, wherein the chip stack is electrically connected to the connecting module;
a second insulating encapsulant surrounding the chip stack; and
a plurality of conductive wires embedded in the second insulating encapsulant, wherein the chip stack is electrically connected to the connecting module through the conductive wires, and the conductive wires extend into the plurality of second openings of the protection layer to directly contact to the plurality of conductive caps.

2. The package structure according to claim 1, further comprising a plurality of conductive terminals disposed on the redistribution structure opposite to the die and the connecting module.

3. The package structure according to claim 1, further comprising an underfill disposed between the redistribution structure and the die.

4. The package structure according to claim 1, wherein a material of the protection layer is different from a material of the first insulating encapsulant.

5. The package structure according to claim 1, wherein the second encapsulant fills into the second openings of the protection layer.

6. The package structure according to claim 1, further comprising a plurality of dummy dies disposed between the die and the connecting module.

7. A manufacturing method of a package structure, comprising:
providing a carrier;
forming a redistribution structure on the carrier, the redistribution structure comprising:
a conductive pattern; and
a dielectric layer, disposed on the conductive pattern and having a plurality of first openings to expose the conductive pattern;
disposing a plurality of dies and a plurality of connecting modules on the redistribution structure, each of the connecting modules having a protection layer, a plurality of conductive caps, a plurality of barrier layers, a plurality of conductive bars, and a plurality of conductive bumps, wherein:
the plurality of conductive caps, the plurality of barrier layers, and the plurality of conductive bars are embedded in the protection layer;
the plurality of conductive bars are disposed on and directly contact the plurality of conductive bumps;
the plurality of barrier layers are disposed on and directly contact the plurality of conductive bars;
the plurality of conductive caps are disposed on and directly contact the plurality of barrier layers;
a material of the conductive bars is different from a material of the conductive caps;
the material of the conductive bars comprises copper;
the material of the conductive caps does not comprise copper; and
the connecting modules are disposed on the redistribution structure through a picked-and-placed process such that the plurality of conductive bumps are embedded within the plurality of first openings of the dielectric layer to directly contact to the conductive pattern and a side wall of the plurality of first openings;
forming a first insulating encapsulant to encapsulate the dies and the connecting modules, wherein a portion of the first insulating encapsulant is disposed between the redistribution structure and the connecting module to directly contact a portion of the side wall of the plurality of conductive bumps, and there is no interface in the first insulating encapsulant;
removing the carrier from the redistribution structure;
forming a plurality of second openings in the protection layer of the connecting modules, wherein:
one of the plurality of conductive caps, one of the plurality of bather layers, one of the plurality of conductive bars, and one of the plurality of conductive bumps are disposed corresponding to each of the plurality of second openings; and
the plurality of second openings of the protection layer exposes at least a portion of each conductive cap;
disposing a chip stack on the dies and the first insulating encapsulant opposite to the redistribution structure;
forming a plurality of conductive wires, wherein the chip stack is electrically connected to the connecting modules through the plurality of conductive wires, and the plurality of conductive wires extend into the second openings of the protection layer to directly contact to the plurality of conductive caps; and encapsulating the chip stack by a second insulating encapsulant, wherein the plurality of conductive wires are embedded in the second insulating encapsulant.

8. The method according to claim 7, further comprising forming a plurality of conductive terminals on the redistribution structure opposite to the dies and the connecting modules.

9. The method according to claim 7, further comprising performing a singulation process.

10. The method according to claim 7, further comprising forming an underfill between the redistribution structure and the dies.

11. The method according to claim 7, wherein the dies are connected to the redistribution structure through flip-chip bonding.

12. The method according to claim 7, further comprising placing a plurality of dummy dies between the dies the connecting modules.

13. The method according to claim 7, wherein the die has an active surface and a rear surface opposite to the active surface, the die comprises a plurality of conductive connectors located on the active surface, and the step of forming the first insulating encapsulant comprises:

forming an insulating material over the redistribution structure to cover the dies and the connecting modules; and removing a portion of the insulating material to expose the protection layer of the connecting modules and the rear surfaces of the dies.

* * * * *